(12) United States Patent
Ichihara

(10) Patent No.: US 6,570,914 B1
(45) Date of Patent: May 27, 2003

(54) AMPLITUDE CALCULATION CIRCUIT

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 502 days.

(21) Appl. No.: 09/607,144

(22) Filed: Jun. 29, 2000

(30) Foreign Application Priority Data

Jul. 7, 1999 (JP) .......................................... 11-192473

(51) Int. Cl.$^7$ .......................... H04B 17/00; H04L 27/36
(52) U.S. Cl. ...................... 375/224; 375/296; 375/298; 375/345; 370/252; 324/76.13
(58) Field of Search ................................ 375/224, 261, 375/271, 296, 298, 302, 345; 370/252; 324/76.13

(56) References Cited

U.S. PATENT DOCUMENTS 5,742,636 A  * 4/1998 Fukushi ....................... 375/130
6,400,774 B1 * 6/2002 Matsuoka et al. ........... 375/295
6,418,173 B1 * 7/2002 Matsuoka et al. ........... 375/297

FOREIGN PATENT DOCUMENTS

GB    2 220 315 A    1/1990

OTHER PUBLICATIONS

Sundstorm L., et al., "Quantization Analysis and Design of a Digital Predistortion Linearizer for RF Power Amplifiers", IEEE Transactions on Vehicular Technology, 45 No. 4, pp. 707–719.

* cited by examiner

*Primary Examiner*—Amanda T. Le
(74) *Attorney, Agent, or Firm*—Scully, Scott, Murphy & Presser

(57) ABSTRACT

An amplitude calculation circuit is capable of permits accurate calculation of an amplitude with quite small circuit scale and power consumption. The amplitude calculation circuit converts input I (in-phase component) and Q(quadrature-phase component) base band signal in first and second absolute value circuits into an input vector $V_{in,0}$. A first phase rotation circuit ($R_0$) rotates the input vector $V_{in,0}$ in clockwise direction for an angle $\theta_0 = 45°$ and multiply the amplitude for $1/\cos(\theta_0)$ times to output an output vector $V_{out,0}$. By deriving an absolute value of the output vector $V_{out,0}$ by a third absolute value circuit, a vector $V_{in,1}$ symmetric to an X-axis is established. Subsequently, the foregoing operation is repeated by the second to fifth phase rotation circuits and fourth to sixth absolute value circuits.

12 Claims, 10 Drawing Sheets

| k | $2^{-k}$ | $\theta_k = \arctan(2^{-k})$ | $1/\cos(\theta_k)$ | $45 \times 2^{-k}$ |
|---|---|---|---|---|
| 0 | 1.0000000000 | 45.0000000000 | 1.4142135624 | 45.0000000000 |
| 1 | 0.5000000000 | 26.5650511771 | 1.1180339887 | 22.5000000000 |
| 2 | 0.2500000000 | 14.0362434679 | 1.0307764064 | 11.2500000000 |
| 3 | 0.1250000000 | 7.1250163489 | 1.0077822185 | 5.6250000000 |
| 4 | 0.0625000000 | 3.5763343750 | 1.0019512214 | 2.8125000000 |

$$c = \prod_{k=0}^{4} \frac{1}{\cos(\theta_k)} = 1.64568891$$

AMPLITUDE CALCULATION CIRCUIT

BACKGROUND OF THE INVENTION

1. Field of the Invention

The present invention relates generally to an amplitude calculation circuit. More particularly, the invention relates to an amplitude calculation circuit for accurately calculating an amplitude in a base band (I signal and Q signal) of a communication device employing a quadrature phase modulation.

2. Description of the Related Art

In the conventional amplitude calculation circuit, an amplitude of a base band [I (In-phase) signal and Q (Quadrature-phase) signal] of a communication device employing an quadrature phase modulation is accurately calculated. In this circuit, from the I, Q base band signals, an amplitude expressed by:

$$A(t)=|G(t)|=\sqrt{[I(t)^2+Q(t)^2]} \quad (1)$$

can be accurately derived.

wherein A(t) is an amplitude of an quadrature modulation wave, t is a time, G(t) is an quadrature modulation wave, I is an amplitude of a component (in-phase component) in-phase relationship with a carrier, and Q is an amplitude of a component (quadrature phase component) in an quadrature phase relationship with the carrier. The foregoing technology will be an important technology toward future in an quadrature phase modulation type communication system.

For example, it becomes necessary to derive an amplitude from received I and Q signals, to compare with a predetermined value, and to perform AGC (Automatic Gain Control). Conventionally, there is no method for deriving the amplitude from the I and Q signals simply and in high precision. In this circumstance, currently, an approximated value expressed by:

$$A'=\max(|I|,|Q|)+\tfrac{1}{2}\cdot\min(|I|,|Q|) \quad (2)$$

has been used. This contains significant error in comparison with the correct amplitude.

On the other hand, if a instantaneous amplitude can be accurately calculated from the base band signal at a transmission side, it becomes possible to perform control for increasing a bias current of a transmission power amplifier when the amplitude is large and for decreasing the bias current of the transmission power amplifier, using the result of calculation of the instantaneous amplitude. By performing such control, a distortion at a peak of the amplitude can be reduced with maintaining an average consumption of current.

Furthermore, currently, in order to achieving improvement of efficiency of a transmission amplifier, a predistorter which is a kind of linearizer is considered as promising. In the predistorter, accurate amplitude calculation is inherently required. An example of this is shown in FIG. 11.

In FIG. 11, an input signal Sr is consisted of a base band signal Ir of an in-phase component with a transmission carrier and a base band signal Qr of quadrangular-phase component of the transmission carrier. The input signal can be considered as a complex number taking the signal Ir as a real number portion and the signal Qr as an imaginary number portion.

The input signal Sr, namely the signal Ir as the real number portion and the signal Qr as the imaginary number portion operated by complex multiplication with a distortion correction data (real number portion is Re and imaginary number portion Im) from a ROM (read-only-memory) by a complex multiplier 20. The complex multiplier 20 comprises multipliers 1 to 4 and adder and subtracter 5 and 6.

The output of the complex multiplier 20 is a complex signal Sp, in which amplitude and phase of the input signal Sr are corrected so that a characteristics of a non-linear amplifier 11 becomes linear. As a result of complex multiplication, the complex signal Sp is expressed by:

$$Sp=Sr\cdot a\cdot \exp(j\theta) \quad (3)$$

wherein a is an amplitude correction value and θ is a phase correction value.

Accordingly, correction data are expressed by:

$$Re=a\cdot\cos(\theta)$$

$$Im=a\cdot\sin(\theta) \quad (4)$$

The complex signal Sp is a signal derived by multiplying the amplitude of the input signal Sr by a and phase thereof is rotated for θ and can be calculated by using the real number portion Re and the imaginary number portion Im.

Assuming the real number portion of the complex signal Sp is Ip and the imaginary number portion is Qp, Ip and Qp are expressed by:

$$Ip=Re\cdot Ir-Im\cdot Qr$$

$$Qp=Re\cdot Qr+Im\cdot Ir \quad (5)$$

The signals of the real number portion Ip and the imaginary number portion Qp are converted into analog signals by D/A (digital-to-analog) converters (DACs) 7 and 8 and then are converted into high frequency signals by a quadrature modulator 9.

On the other hand, an amplitude calculation circuit 15 calculates and outputs an instantaneous amplitude |Sr| of the input signal Sr. The instantaneous amplitude |Sr| is expressed by:

$$|Sr|=\sqrt{[Ir^2+Qr^2]} \quad (6)$$

This equation (6) is the same as the equation (1).

On the other hand, the output of the non-linear amplifier 11 is branched by a coupler 12 and is rectified by a rectifier 19. Then, an average transmission amplitude is derived by a low-pass filter (LPF) 18. This signal converts into a digital signal by an A/D (analog-to-digital) converter (ADC) 17 to derive an average transmission amplitude.

The instantaneous amplitude |Sr| and the average transmission amplitude of the input signal Sr are multiplied by a multiplier 30. The result (product) of multiplication represents an instantaneous amplitude. This value is used as an address input for a distortion compensation ROM (look-up table) 14.

In the conventional amplitude calculation circuit set forth above, it is required to calculate quite accurately. In order to realize this, a method to read out the amplitude from ROM table with taking the I and Q signals as addresses.

This method has been disclosed in "Quantization Analysis and Design of a Digital Predistortion Linearizer for RF Power Amplifiers" (Sundstrom. L.; Faulkner, M.; Johansson, M., Vehicular Technology, IEEE Trans., Vol. 45 4, page 707–719).

However, in such method, ROM having quite large capacity becomes necessary for deriving accurate amplitude. This has been the most important problem. As set forth above, it has been important task for calculating accurate amplitude from the I, Q base band signals irrespective of transmission side or reception side in the quadrature phase modulation type communication device.

SUMMARY OF THE INVENTION

The present invention has been worked out in view of the problems set forth above. Therefore, it is an object of the present invention to provide an amplitude calculation circuit which can calculate an accurate amplitude with quite small circuit scale and quite small power consumption.

According to the first aspect of the present invention, an amplitude calculation circuit comprises:

a plurality of circuits, each including
an absolute value calculating circuit receiving a pair of base band signals and calculating respective absolute values thereof; and
a phase rotation circuit receiving the absolute values as components of two-dimensional vector and rotating the two-dimensional vector over a predetermined rotational angle for outputting as component of the vector;
the plurality of circuits being connected in cascade connection for receiving respective of the base band signals as input signal at a first stage and outputting an output of the phase rotation circuit of a final stage as a result of amplitude calculation.

Namely, the amplitude calculation circuit of the present invention relates to the circuit for calculating the amplitude of a high frequency signal from a values of I and Q base band signals in a radio transmitter device generating a high frequency signal through an quadrature phase modulation of I and Q base band signals or in a radio receiver device reproducing the I and Q base band signals by quadrature demodulation of a received high frequency signal.

The amplitude calculation circuit according to the present invention is a digital signal processing circuit. The I (in-phase component) signal and the Q (quadrature-phase component) signal as the input signals are also digital base band signals. These digital base band signals are digital signals before D/A (digital-to-analog) conversion in the radio transmitter device and digital signals after A/D (analog-to-digital) conversion of an analog base band signal received in the radio receiver device.

In the amplitude calculation circuit according to the present invention, the base band signals of quadrature phase modulation wave are two kinds of signals of I signal and Q signal. The quadrature phase modulation wave G(t) is expressed as follow by using I and Q signals:

$$G(t)=I(t)\cdot\cos(2\pi fc\cdot t)-Q(t)\cdot\sin(2\pi fc\cdot t) \quad (7)$$

wherein t is a time, and fc is a frequency of carrier.
When carrier F(t) is expressed by:

$$F(t)=p\cdot\cos(2\pi fc\cdot t) \quad (8)$$

I is an amplitude of a component (namely in-phase component) of in-phase relationship with the carrier, and Q is an amplitude of a component (namely quadrature-phase component) of quadrature phase relationship with the carrier.

From the foregoing equation (6), the amplitude A(t) of the quadrature phase modulation wave becomes the foregoing equation (1). In practice, the amplitude A(t) becomes a value of constant multiple of the value derived by the equation (1) with a gain of a radio circuit, A/D converter, D/A converter or the like. However, it can be defined that the amplitude A(t) is calculated through the equation (1) without losing general applicability.

The present invention is directed to a method for configuring a circuit for simply deriving a value proportional to the amplitude A(t) of the quadrature phase modulation wave from the I signal and the Q signal. In order to accomplish this, the amplitude calculation circuit according to the present invention, an amplitude calculation circuit comprising:

a plurality of circuits, each including
an absolute value calculating circuit expressed as $A_k$, receiving a pair of base band signals $X^k$ and $Y_k$, where k is in a range of 0 to N which is a positive integer, and calculating respective absolute values $|X^k|$ and $|Y_k|$ thereof; and
a phase rotation circuit expressed as $R_k$, receiving the absolute values $|X^k|$ and $|Y_k|$ as components $X_{in,k}$ and $Y_{in,k}$ of two-dimensional vector $V_{in,k}$ and rotating the two-dimensional vector over a predetermined rotational angle θ for outputting as components $X_{out,k}$, $Y_{out,k}$ of the vector $V_{out,k}$;
the circuits of k=0 to N being connected in cascade connection, input signals $X_0$, $Y_0$ of the first stage being input as respective base band signals I and Q and outputs an output $X_{out,N}$ of the phase rotation circuit $R_N$ at the final stage as a result of amplitude calculation.

In the amplitude calculation circuit, assuming that input signals of the phase rotation circuit $R_k$ are $X_{in,k}$ and $Y_{in,k}$ and output signals are $X_{out,k}$ and $Y_{out,k}$, the phase rotation circuit comprises a first shift circuit shifting the input signal $X_{in,k}$ for k bits, a second shift circuit shifting the input signal $Y_{in,k}$ for k bits, an adder for adding the input signal $X_{in,k}$ and a result of shifting operation of the second shift circuit, and a first subtracter for subtracting a result of shifting operation of the first shift circuit from the input signal $Y_{in,k}$, an output of the adder is taken as the output signal $X_{out,k}$ and an output of the first subtracter is taken as the output signal $Y_{out,k}$.

Also, in the amplitude calculation circuit, for the phase rotation circuits $R_k$, in which k is greater than 1, the signal $X^k$ is directly input as the input signal $X_{in,k}$ bypassing the absolute value circuit $A_k$, and an absolute value $|Y_k|$ of the signal $Y_k$ derived via the absolute value circuit $A_k$ is input as the input signal $Y_{in,k}$.

Furthermore, in the amplitude calculation circuit, the phase rotation circuit $R_k$, in which k is within a range from 0 to N−1, further comprises a second subtracter for subtracting the input signal $Y_{in,k}$ from a result of shifting operation by the first shift circuit, an output of the second subtracter is taken as $-Y_{out,k}$,
the absolute value circuit $A_{k+1}$ at the stage next to a stage where the phase rotation circuit $R_k$ is present, performs calculation of the absolute value by selective outputting $Y_{out,k}$ when a value of the output signal $Y_{out,k}$ is positive and $-Y_{out,k}$ when the value of the output signal $Y_{out,k}$ is negative.

The phase rotation circuit $R_N$ at the final stage may exclude the first subtracter, the second subtracter and the first shift circuit and thus output only the output signal $X_{out,N}$ without outputting the output signal $Y_{out,N}$ and $-Y_{out,N}$.

The amplitude calculation circuit may insert delay means in a signal transmission path between each phase rotation circuit $R_k$ and each absolute value circuit.

By this, it becomes possible to obtain a quite accurately calculated value of the amplitude with a combination of lesser number of the absolute value circuits, the shift circuits, the adders and the subtracters. In this case, no multiplier which requires high power consumption and large circuit scale, is used. Accordingly, in comparison with the amplitude calculation circuit with a ROM table used in the conventional predistributor, calculation of the amplitude with higher precision can be done with smaller circuit scale and lower power consumption.

BRIEF DESCRIPTION OF THE DRAWINGS

The present invention will be understood more fully from the detailed description given hereinafter with reference to the accompanying drawings of the preferred embodiment of the present invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
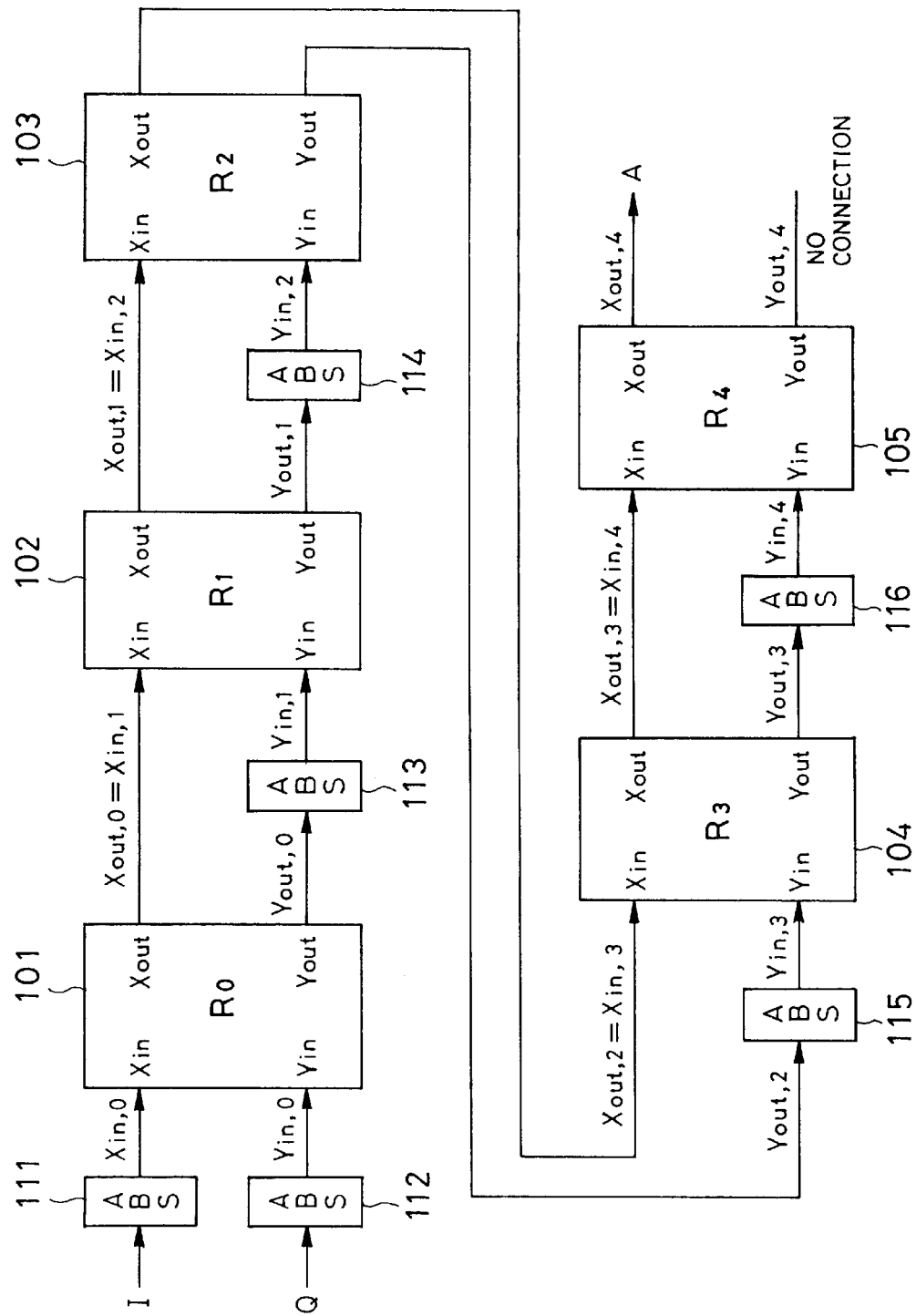
FIG. 1 is a block diagram showing a construction of one embodiment of an amplitude calculation circuit according to the present invention.

FIG. 1 is a block diagram showing a construction of one embodiment of an amplitude calculation circuit according to the present invention. In FIG. 1, one embodiment of the amplitude calculation circuit is constructed with a phase rotation circuits ($R_k$) 101 to 105 and absolute value circuits (ABS) 111 to 116 calculating absolute values of the signals.

In the phase rotation circuits 101 to 105, k is integer of 0 to 4. The value k is not limited to 4 but can be 5 or more if higher precision is desired for deriving the amplitude.

Figure 2:
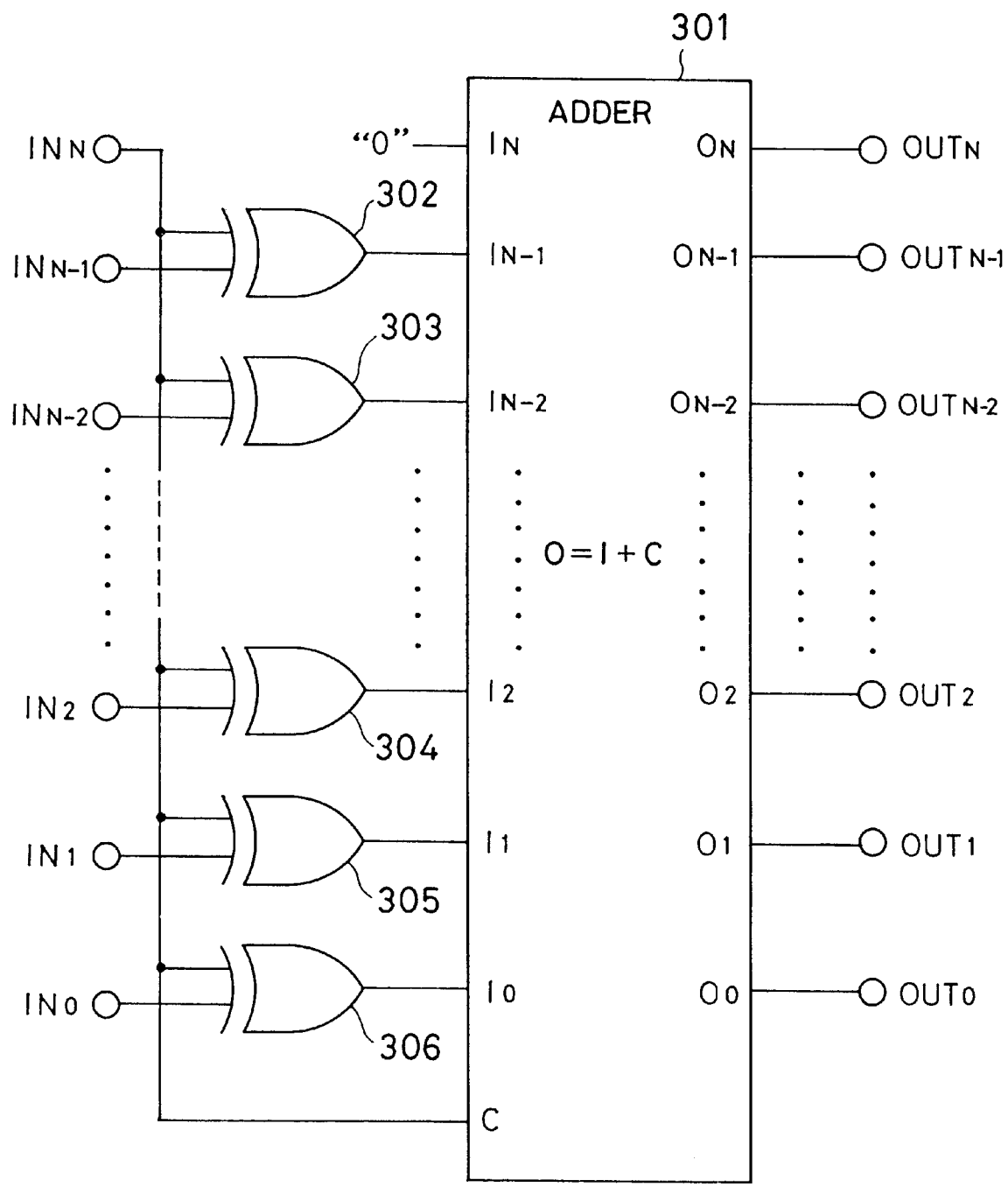
FIG. 2 is an illustration showing an example of construction of each absolute value circuit of FIG. 1.

FIG. 2 is an illustration showing an example of construction of each absolute value circuit 111 to 116 of FIG. 1. In FIG. 2, there is shown an example of the absolute value circuits 111–116 in the case where the signal is expressed by complement of 2.

When a sign bit of an input signal IN is assumed to be $IN_N$, the sign bit is added to a value, each bit of which is inverted by an exclusive OR gates 302 to 306 only when the signal is negative, namely when $IN_N$ is "1", by an adder 301. By this an absolute value is obtained at the output OUT.

On the other hand, since the sign bit is "0" when the signal is 0 or positive, the exclusive OR gates 302 to 306 transmit the signals as they are. On the other hand, the sign bit to be added by the adder 301 is "0", the input signal is transmitted to the output OUT as is. Namely, when the input is negative, the absolute value can be obtained by outputting positive value with inverting the polarity.

Figures 3, 4:
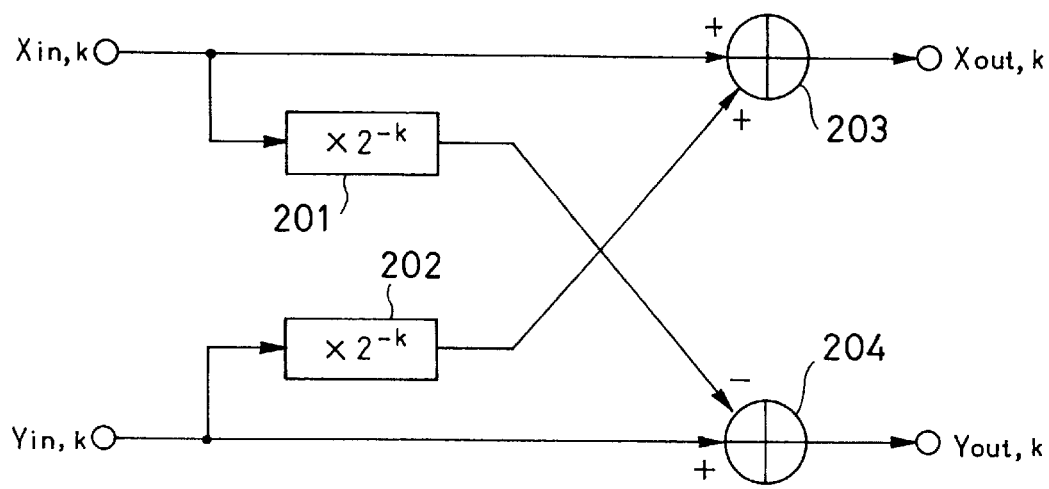
FIG. 3 is a block diagram showing a construction of a phase rotation circuit of FIG. 1.
FIG. 4 is an illustration showing variation of a rotational angle and amplitude of the phase rotation circuit with respect to a value of k and a phase rotation angle ideal value.

FIG. 3 is a block diagram sowing a construction of the phase rotation circuits 101 to 105 of FIG. 1. In FIG. 3, blocks 201 and 202 are circuits for multiplying the signals ½$^k$ times by shifting for k bits. A block 203 is an adder and a block 204 is a subtracter.

In FIG. 3, output signals $X_{out,k}$ and $Y_{out,k}$ can be expressed by:

$$X_{out,k} = X_{in,k} + 2^{-2} \cdot Y_{in,k}$$
$$Y_{out,k} = Y_{in,k} - 2^{-2} \cdot X_{in,k} \quad (9)$$

from input signals $X_{in,k}$ and $Y_{in,k}$.

Here, assuming $$2^{-k} = \tan(\theta_k)$$
$$\theta_k = \arctan(2^{-k}) \quad (10)$$

the equation (9) is re-written into an expression of matrix operation as follow:

$$\begin{bmatrix} X_{out,k} \\ Y_{out,k} \end{bmatrix} = \frac{1}{\cos(\theta_k)} \cdot \begin{bmatrix} \cos(\theta_k) & \sin(\theta_k) \\ -\sin(\theta_k) & \cos(\theta_k) \end{bmatrix} \cdot \begin{bmatrix} X_{in,k} \\ Y_{in,k} \end{bmatrix} \quad (11)$$

A vector taking the input signal as component is assumed as vector $V_{in,k}$ and a vector taking the output signal as component is assumed as vector $V_{out,k}$. Namely, $V_{in,k}$ and $V_{out,k}$ are expressed by:

$$V_{in,k} = \begin{pmatrix} X_{in,k} \\ Y_{in,k} \end{pmatrix}^t, \quad V_{out,k} = \begin{pmatrix} X_{out,k} \\ Y_{out,k} \end{pmatrix}^t \quad (12)$$

The foregoing equation (11) shows that $V_{out,k}$ is derived by multiplying the amplitude of $V_{in,k}$ by $1/\cos(\theta_k)$ and is rotated for $\theta_k$ in negative direction (clockwise).

FIG. 4 is an illustration showing variation of rotational angle and amplitude of the phase rotation circuit with respect to the value of k and an ideal value of the phase rotation angle. In FIG. 4, $\theta_k$ and $1/\cos(\theta_k)$ with respect to each of k values are shown. By this, $\theta_0$ is 45°. It should be appreciated that other $\theta_k$ is a value close to $45 \times 2^{-k}$ (°).

Figure 5:
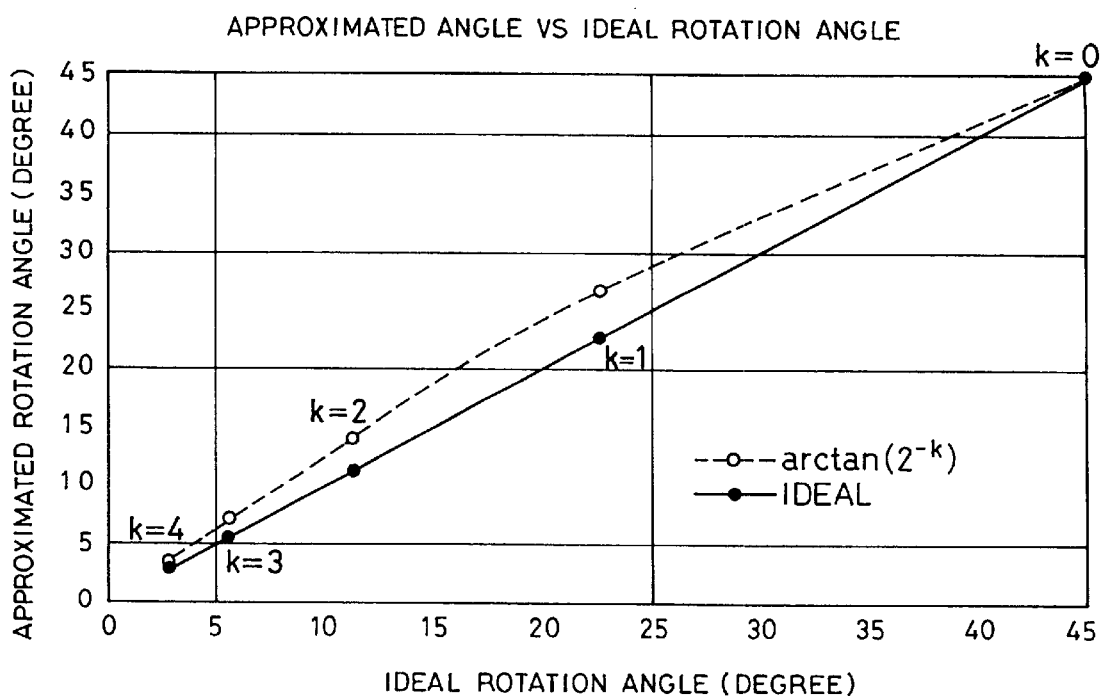
FIG. 5 is an illustration showing comparison of the ideal value of the phase rotation angle and an actual rotation angle.

FIG. 5 is an illustration showing a comparison of the ideal value of the phase rotation angle and the actual rotation angle. FIG. 5 shows behavior of $\theta_k$ converging. As can be clear from FIG. 5, the characteristic curve becomes upwardly convex curve substantially close to the ideal value of $45 \times 2^{-k}$ (°)

Using such matrix of $\theta_k$, an arbitrary angle from −90° to +90° can be approximately expressed by a sum or difference of combination of $\theta_k$. Accordingly, by appropriately combining the phase rotation circuits $R_k$, approximated rotation of an arbitrary angle in a range from $-90°$ to $+90°$ is obtained.

Hereinafter, operation of the shown embodiment will be discussed. At first, in FIG. 1, the input signal is I (in-phase component) base band signal and Q (quadrature-phase component) base band signal. These base band signals are converted into positive values by the absolute value circuits 111 and 112, respectively. This operation is an arithmetic operation for shifting the vector (I, Q) to the first quadrant on a two-dimensional X-Y plane without changing the amplitude. A result is the input vector $V_{in,k}$ of the phase rotation circuit 101.

Figure 6:
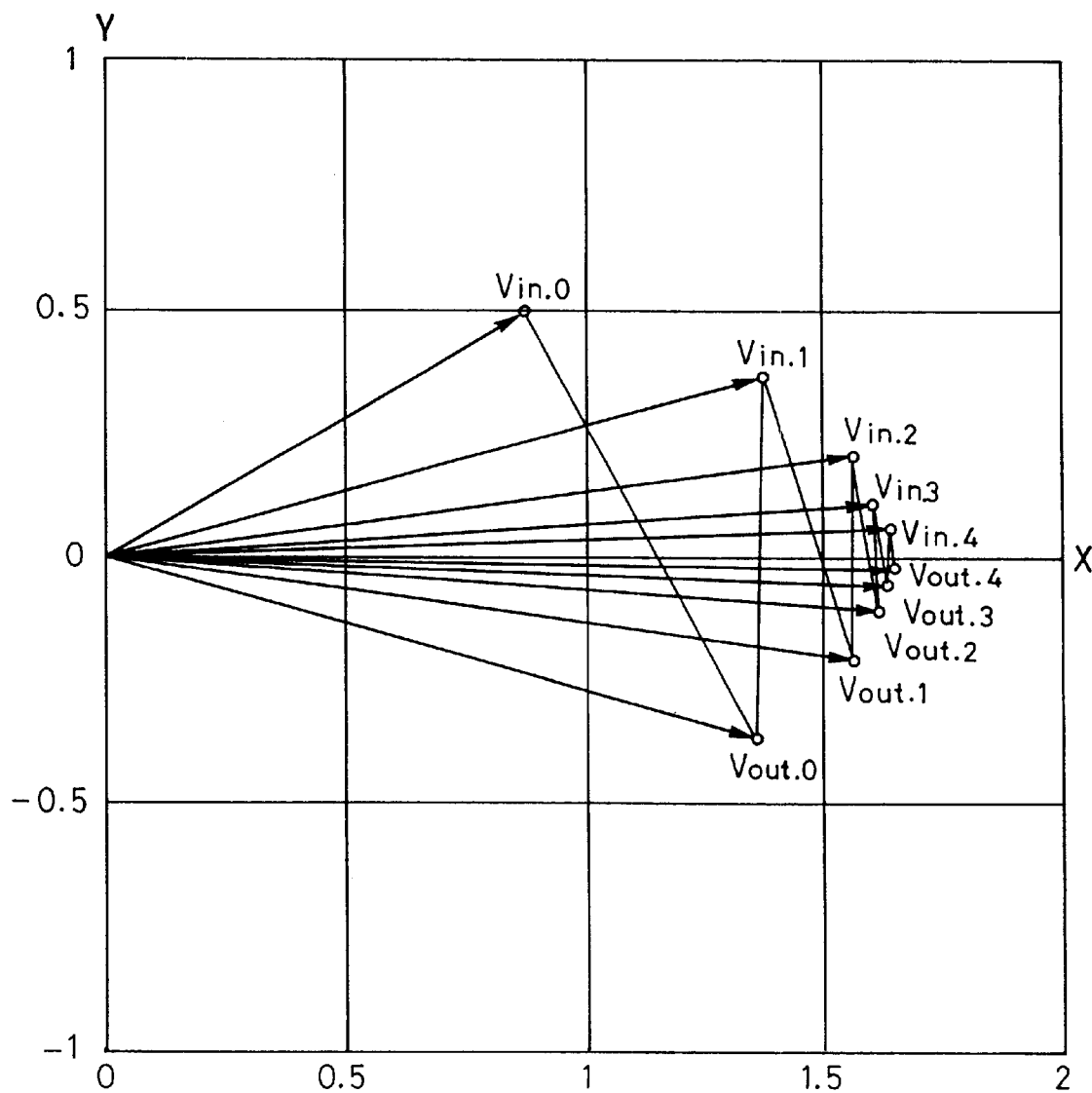
FIG. 6 is an illustration showing convergence condition of an input vector and an output vector of each phase rotation circuit shown in FIG. 1.

FIG. 6 is an illustration showing convergence condition of an input vector and an output vector of each phase rotation circuit ($R_k$) 101 to 105 shown in FIG. 1. Operation of each phase rotation circuit ($R_k$) 101 to 105 will be discussed using FIGS. 1, 3 and 6. The vector of the input signal of each phase rotation circuit ($R_k$) 101 to 105 is taken as the input vector $V_{in,k}$ and the output signal is taken as the output vector $V_{out,k}$.

At first, as shown in FIG. 6, the input vector $V_{in,0}$ is located within the first quadrant. Applying this input vector $V_{in,0}$ to the phase rotation circuit $R_0$, rotation is caused for $\theta=45°$ in clockwise direction. Then, the amplitude of the input signal becomes $1/\cos(\theta_0)$ times.

While this vector is the output vector $V_{out,0}$, it extend from the first quadrant. Then, Y component becomes negative. By taking the absolute value of this by the absolute value circuit 113, a vector $V_{in,0}$ symmetric relative to X-axis can be obtained. Subsequently, repeating the foregoing operation in the phase rotation circuits ($R_1$) 102, ($R_2$) 103, ($R_3$) 104 and ($R_4$) 105, and in the absolute value circuits 113 to 116, the characteristics shown in FIG. 6 can be obtained through the following process:

input vector $V_{in,0}$→output vector $V_{out,0}$→input vector
$V_{in,1}$→output vector $V_{out,1}$→input vector
$V_{in,2}$→output vector $V_{out,2}$→input vector
$V_{in,3}$→output vector $V_{out,3}$→input vector
$V_{in,4}$→output vector $V_{out,4}$ to gradually converge into the vector overlapping with X-axis. if k is set greater, it may overlap as exact as possible.

It should be appreciated that during this period, if executed up to k=4, the vector size becomes:

$$c = \prod_{k=0}^{4} \frac{1}{\cos(2^{-k})} \approx 1.64568891 \qquad (13)$$

times. Even by execution up to k=4, an angular error with the X-axis is within $\pm 3.6°$ and thus can be said that it substantially overlaps with the X-axis. Accordingly, $X_{out,4}$ as the X output of the final phase rotation circuit (R4) 105 becomes substantially 1.64568891 times of the original input amplitude.

Namely, by the circuit of FIG. 1, a value of a constant (=1,64568891) times of the amplitude A [given by the foregoing equation (1)] of the input base band signals I, Q, can be calculated.

As set forth above, by using one embodiment of the present invention, a value of the amplitude multiplied by a constant value can be calculated from the input base band signals I and Q. As discussed above, in the case where phase rotation is performed up to k=4, the final error of the angle is within $\pm 3.6°$. From this, an error e in calculation of the amplitude can be:

$$e=(1-\cos(3.6°))\times 100\% \approx 0.2\% \qquad (14)$$

Namely, the calculation error of the amplitude is a value equal to or less than 0.2% with respect to the value of 1.64568891 times of A. this is equivalent to 1 LSB (least significant bit) in 9-bit precision signal, and thus is quite accurate.

As set forth above, with the foregoing one embodiment of the present invention, it becomes possible to obtain the calculated value of the amplitude with quite high precision with the combination of lesser number of absolute value circuits 111 to 116 and the phase rotation circuits 101 to 105 (constituted with the shift circuits, adder and subtracters). In this case, no multiplier which is high power consumption and large circuit scale. Accordingly, in comparison with the amplitude calculation circuit with the ROM table used in the conventional predistributor, accurate calculation of the amplitude can be performed with quite small circuit scale and power consumption.

Figure 7:
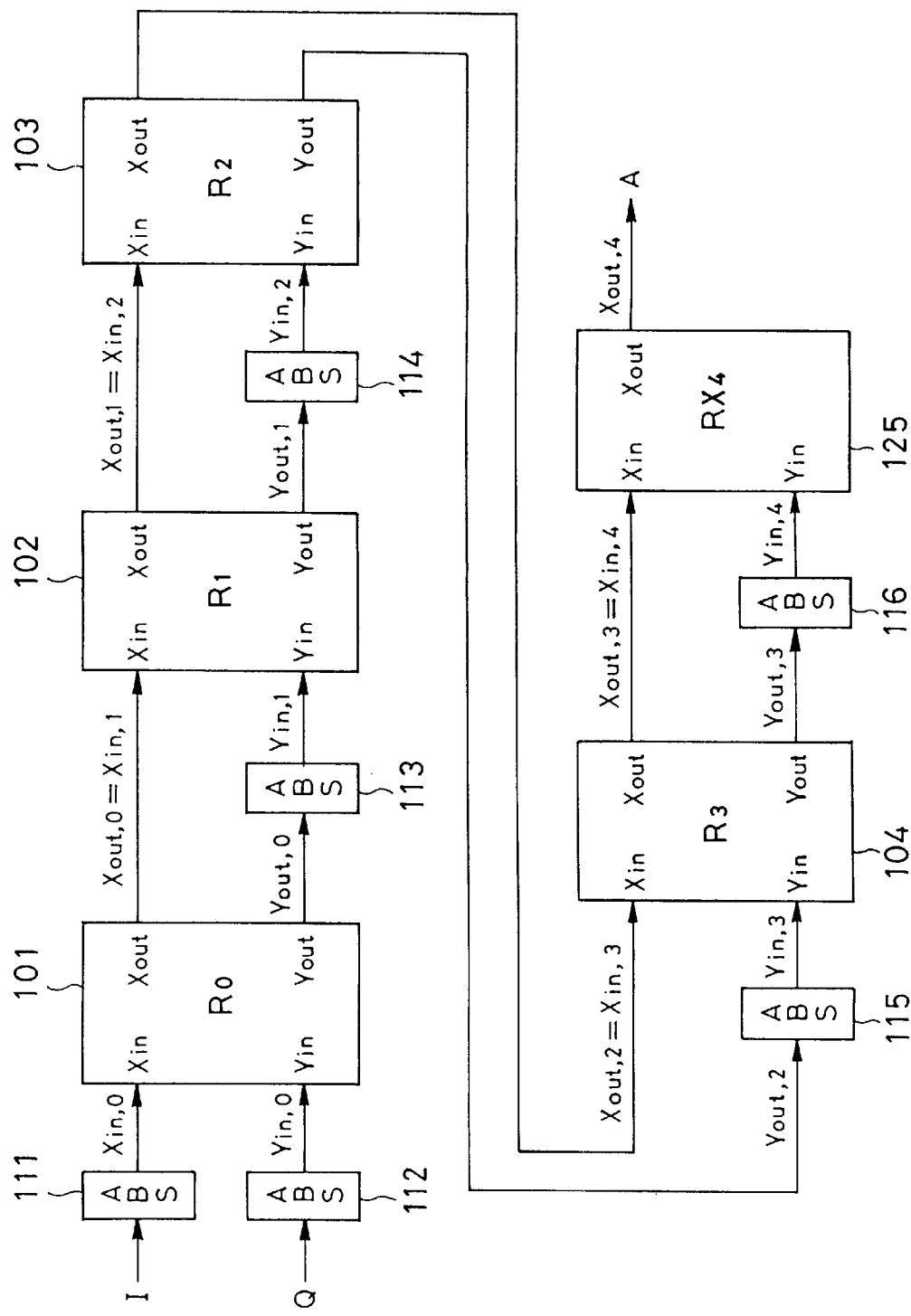
FIG. 7 is a block diagram showing a construction of another embodiment of the amplitude calculation circuit according to the present invention.

FIG. 7 is a block diagram showing a construction of another embodiment of the amplitude calculation circuit according to the present invention. In FIG. 7, another embodiment of the amplitude calculation circuit according to the present invention is the same as the one embodiment of the amplitude calculation circuit of the present invention set forth above, in the basic construction, but some circuits are omitted therefrom.

Namely, only construction of the final phase rotation circuit ($RX_4$) 125 is differentiated from one embodiment of the amplitude calculation circuit of the present invention. In one embodiment of the amplitude calculation circuit according to the present invention shown in FIG. 1, the output $Y_{out,4}$ of the final phase rotation circuit ($R_4$) 105 is not used and is left not-used.

Accordingly, the circuit generating the output $Y_{out,4}$ is wasteful. Therefore, in another embodiment of the amplitude calculation circuit of the present invention, only final phase rotation circuit ($RX_4$) 125 does not have the construction shown in FIG. 3.

Figure 8:
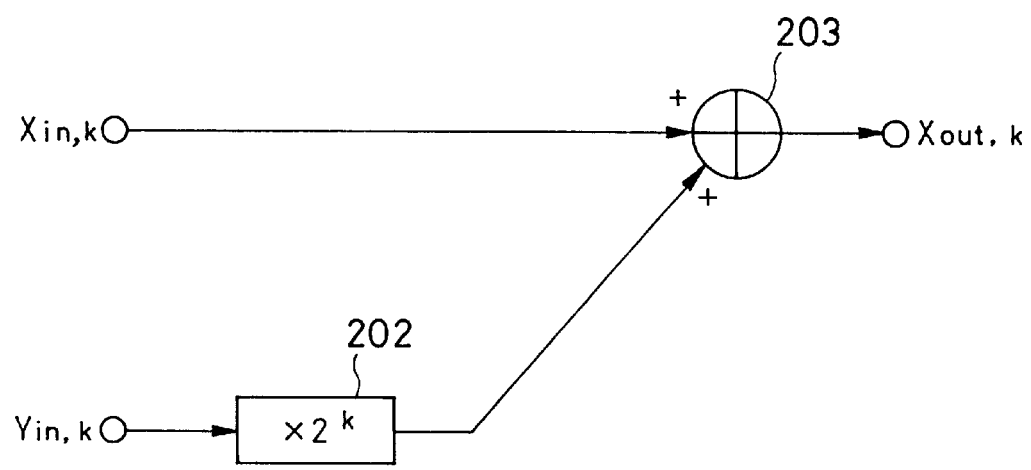
FIG. 8 is a block diagram showing a construction of the phase rotation circuit of FIG. 7.

FIG. 8 is a block diagram showing a construction of the final phase rotation circuit ($RX_4$) 125 of FIG. 7. In FIG. 8, the phase rotation circuit ($RX_4$) is constructed by omitting the circuit for multiplying the signal by $\frac{1}{2}^k$ by shifting for k bits and the subtracter 204 from the construction shown in FIG. 3 and thus with only circuit 202 for multiplying the signal by $\frac{1}{2}^k$ by shifting for k bits and the adder 203. By this, circuit scale can be slightly reduced.

Figure 9:
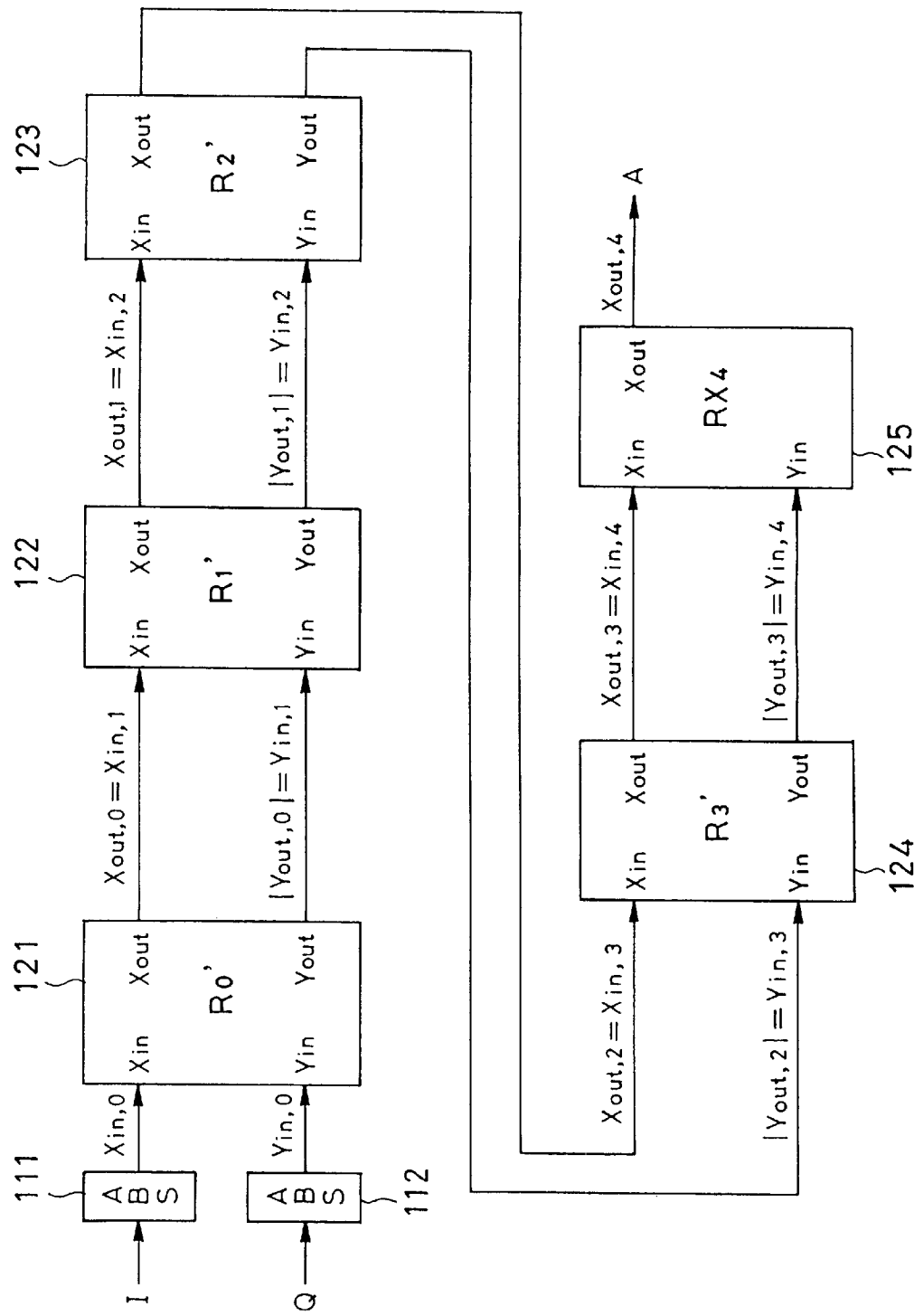
FIG. 9 is a block diagram showing a construction of a further embodiment of the amplitude calculation circuit according to the present invention.

FIG. 9 is a block diagram showing a construction of a further embodiment of the amplitude calculation circuit according to the present invention. In FIG. 9, the absolute value circuits 113 to 116 to be used in the foregoing one embodiment of the amplitude calculation circuit according to the invention are loaded in phase rotation circuits 121 to 124.

Figure 10:
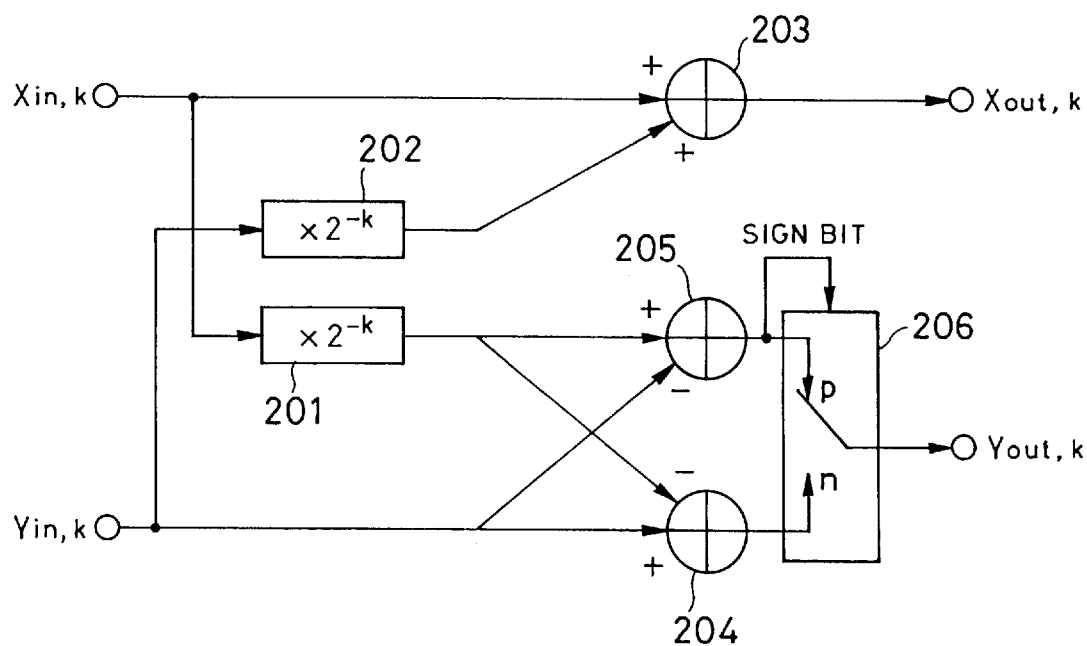
FIG. 10 is a block diagram showing a construction of the phase rotation circuit of FIG. 9.
Figure 11:
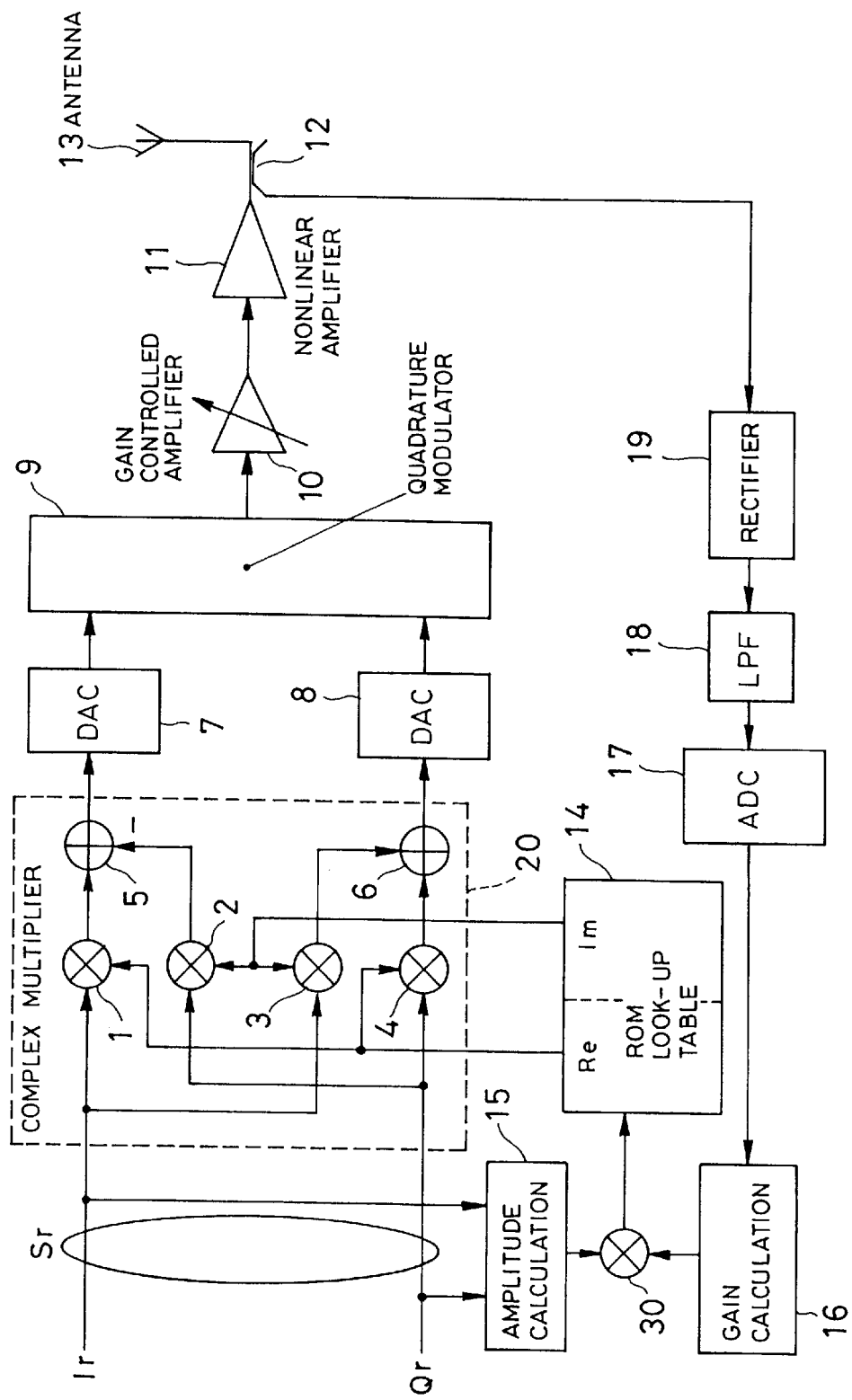
FIG. 11 is an illustration showing an application to the conventional linearizer (predistorter).

FIG. 10 is a block diagram showing a construction of the phase rotation circuits 121 to 124 of FIG. 9. In FIG. 10, the phase rotation circuits 121 to 124 are added subtracter circuits 205 and data selectors 206 to the construction shown in FIG. 3.

An output of the subtracter circuit 205 has a polarity opposite to that of the output of the subtracter 204. The data selector 206 is driven by a sign bit of the output of the subtracter circuit 205 for performing control so that positive value is always selected for outputting. By this, the Y output of the phase rotation circuit ($R_k$) always becomes $|Y_{out,k}|$. Accordingly, the absolute value circuit of the later stage can be omitted.

The foregoing method is advantageous in improvement of operation speed. The reason is that, when expression of complement of 2 is used, an adder 301 becomes inherent for performing absolute value arithmetic operation. Therefore, in the constructions shown in FIGS. 1 and 7, number stages of the adders and subtracters on Y side becomes greater to restrict operation speed correspondingly. In contrast to this, in the construction shown in FIG. 10, since the adder of the absolute value circuit can be omitted, number of stages of the adders and the subtracters becomes equal on Y side and X side. Thus, operation speed can be improved.

In addition to the foregoing embodiments of the present invention, as means for breaking limitation for operation speed, it is considered to perform pipeline process by inserting not shown delay circuit, such as register, latch circuit or the like, to a signal transmission path of each absolute value circuit and each phase rotation circuit. Also, in replace of the absolute value circuit, it is possible to use a circuit constantly outputting negative value, to rotate the phase of the phase rotation circuit in counterclockwise direction and other great many variations.

Also, in the foregoing embodiments, discussion has been given for the case where phase rotation is performed up to k=4, the present invention may realize phase rotation more than four times.

With the present invention discussed above, circuits, in each of which the absolute value calculation circuit calculating the absolute value by inputting a pair of base band signals and the phase rotation circuit receiving input of the absolute value as component of the two-dimensional vector, rotating the two-dimensional vector over a predetermined angle, and outputting the component of the vector, are connected in cascade connection to input respective base band signals to the first stage and output the output of the phase rotation circuit of the final stage as the result of amplitude calculation to permit quite accurate amplitude calculation with quite small circuit scale and low power consumption.

Although the present invention has been illustrated and described with respect to exemplary embodiments thereof, it should be understood by those skilled in the art that the foregoing and various changes, emission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. An amplitude calculation circuit comprising:
   a plurality of circuits, each including an absolute value calculating circuit receiving
   a pair of base band signals and calculating respective absolute values thereof; and
   a phase rotation circuit receiving said absolute values as components of two-dimensional vector and rotating said two-dimensional vector over a predetermined rotational angle for outputting as component of the vector;
   said plurality of circuits being connected in cascade connection for receiving respective of said base band signals as input signal at a first stage and outputting an output of said phase rotation circuit of a final stage as a result of amplitude calculation.

2. An amplitude calculation circuit as set forth in claim 1, wherein the input signal of X-axis component is directly input to said phase rotation circuit bypassing said absolute circuit, and
   the input signal of Y-axis component is input to said phase rotation circuit via said absolute value circuit.

3. An amplitude calculation circuit as set forth in claim 1, wherein said phase rotation circuit comprises:
   a first shift circuit f or shifting the input signal of X-axis component;
   a second shift circuit for shifting the input signal of Y-axis component;
   an adder for adding said input signal of the X-axis component and a result of shifting operation of said second shift circuit;
   a first subtracter for subtracting a result of shifting operation of said first shift circuit from the input signal of the Y-axis component, for taking an output of said adder as an output signal of the X-axis component and an output of said first subtracter as an output signal of the Y-axis component.

4. An amplitude calculation circuit as set forth in claim 3, wherein said phase rotation circuit further comprises a second subtracter circuit for subtracting the input signal of the Y-axis component from the result of shifting operation by said first shift circuit, an output of said second subtracter being output as an output signal of negative Y-axis component,
   the absolute value circuit of the next stage outputs the output signal of said Y-axis component as is when a value of said output signal of said Y-axis component is positive, and selects the output signal of said negative Y-axis component when the value of said output signal of said Y-axis component is negative for performing calculation of said absolute value.

5. An amplitude calculation circuit as set forth in claim 4, wherein said phase rotation circuit at the final stage excludes said first subtracter, said second subtracter and said first shift circuit for outputting only output signal of said X-axis component without generating output signal of said Y-axis component and output signal of said negative Y-axis component.

6. An amplitude calculation circuit as set forth in claim 1, wherein delay means is inserted in as signal transmission path between respective of said absolute value circuits and respective of said phase rotation circuits.

7. An amplitude calculation circuit comprising: a plurality of circuits, each including
   an absolute value calculating circuit expressed as $A_k$, receiving a pair of base band signals $X_k$ and $Y_k$, where k is in a range of 0 to N which is a positive integer, and calculating respective absolute values $|X_k|$ and $|Y_k|$ thereof; and
   phase rotation circuit expressed as $R_k$, receiving said absolute values $|X_k|$ and $|Y_k|$ as components $X_{in,k}$ and $Y_{in,k}$ of two-dimensional vector $V_{in,k}$ and rotating said two-dimensional vector over a predetermined rotational angle θ for outputting as components $X_{out,k}$, $Y_{out,k}$ of the vector $V_{out,k}$;
   said circuits of k=0 to N being connected in cascade connection, input signals $X_0$, $Y_0$ of the first stage being input as respective base band signals I and Q and outputs an output $X_{out,N}$ of the phase rotation circuit $R_N$ at the final stage as a result of amplitude calculation.

8. An amplitude calculation circuit as set forth in claim 7, wherein, for said phase rotation circuits $R_k$, in which k is greater than 1, said signal $X_k$ is directly input as said input signal $X_{in,k}$ bypassing said absolute value circuit $A_k$, and an absolute value $|Y_k|$ of said signal $Y_k$ derived via said absolute value circuit $A_k$ is input as said input signal $Y_{in,k}$.

9. An amplitude calculation circuit as set forth in claim 7, wherein, assuming that input signals of said phase rotation circuit $R_k$ are $X_{in,k}$ and $Y_{in,k}$ and output signals are $X_{out,k}$ and $Y_{out,k}$, said phase rotation circuit comprises a first shift circuit shifting said input signal $X_{in,k}$ for k bits, a second shift circuit shifting said input signal $Y_{in,k}$ for k bits, an adder for adding said input signal $X_{in,k}$ and a result of shifting operation of said second shift circuit, and a first subtracter for subtracting a result of shifting operation of said first shift circuit from said input signal $Y_{in,k}$, an output of said adder is taken as said output signal $X_{out,k}$ and an output of said first subtracter is taken as said output signal $Y_{out,k}$.

10. An amplitude calculation circuit as set forth in claim 9, wherein the phase rotation circuit $R_k$, in which k is within a range from 0 to N−1, further comprises a second subtracter for subtracting said input signal $Y_{in,k}$ from a result of shifting operation by said first shift circuit, an output of said second subtracter is taken as $-Y_{out,k}$, the absolute value circuit $A_{k+1}$ at the stage next to a stage where said phase rotation circuit $R_k$ is present, performs calculation of said absolute value by selective outputting $Y_{out,k}$ when a value of the output signal $Y_{out,k}$ is positive and $-Y_{out,k}$ when the value of the output signal $Y_{out,k}$ is negative.

11. An amplitude calculation circuit as set forth in claim 10, wherein said phase rotation circuit $R_N$ at the final stage excludes said first subtracter, said second subtracter and said first shift circuit and thus outputs only said output signal $X_{out,N}$ without outputting said output signal $Y_{out,N}$ and $-Y_{out,N}$.

12. An amplitude calculation circuit as set forth in claim 7, wherein delay means is inserted in a signal transmission path between each phase rotation circuit $R_k$ and each absolute value circuit $A_k$.

\* \* \* \* \*